United States Patent [19]

Nelson

[11] 4,158,717
[45] Jun. 19, 1979

[54] SILICON NITRIDE FILM AND METHOD OF DEPOSITION
[75] Inventor: Norvell J. Nelson, Palo Alto, Calif.
[73] Assignee: Varian Associates, Inc., Palo Alto, Calif.
[21] Appl. No.: 768,659
[22] Filed: Feb. 14, 1977
[51] Int. Cl.² ............................................. B05D 3/06
[52] U.S. Cl. ...................................... 428/446; 427/35
[58] Field of Search ...................... 427/35, 37, 38–42, 427/94, 95; 428/538, 446

[56] References Cited
U.S. PATENT DOCUMENTS 3,424,661  1/1969  Androshuk ........................ 427/39 X
3,637,423  1/1972  Sestrich ............................. 427/94 X Primary Examiner—Bernard D. Pianalto
Attorney, Agent, or Firm—Stanley Z. Cole; Richard B. Nelson; Peter J. Sgarbossa

[57] ABSTRACT

A dense film of silicon nitride is deposited by a plasma discharge in a vapor of azidotrimethylsilane (AZS) $(CH_3)_3 SiN_3$. AZS is less reactive and easier to handle than the previously used silane $SiH_4$. The resulting film is more stable chemically than the silicon nitride produced by other processes. It is useful for protective and anti-reflective coatings, for insulating, and for masking, particularly on semiconductive devices.

2 Claims, 2 Drawing Figures

SILICON NITRIDE FILM AND METHOD OF DEPOSITION

FIELD OF THE INVENTION

The invention pertains to film coatings which may be used, inter alia, for insulating, passivating, protecting or reducing reflections at the surface of semiconductive devices.

PRIOR ART

Silicon nitride ($SI_3N_4$) has become well-known as an insulating and passivating layer for semiconductive devices. Such films are described in the "Handbook of Electronic Materials" Vol. 3, J. T. Milek, Ed. IFI/-Plenum, New York (1971). The use of silicon nitride passivating films formed at low temperature to avoid damaging the device is described in "Nitride Film Seals at Low Temperature", Electronics 49, No. 5, page 40 (1974).

The specific use of an electric discharge to deposit silicon nitride from a vapor is described in chapter 9 of "Techniques and Applications of Plasma Chemistry", J. R. Hollahan and A. T. Bell, Ed., John Wiley & Sons, New York (1974).

These prior art methods of depositing silicon nitride have used a vapor of a silane ($SiH_4$) mixed with nitrogen or a gaseous nitrogen compound such as ammonia, as described by R. Gareth and W. Scherber, "Journal of the Electrochemical Society", Vol. 119, page 1248 (1972). However, $SiH_4$ is an extremely reactive, dangerous compound. It reacts violently with air, water, etc. to produce silicon oxides which degrade the nitride layer.

DESCRIPTION OF THE PREFERRED EMBODIMENTS

The inventive process and product will be described as employing azidotrimethylsilane (AZS,1) having formula $(CH_3)_3 SiN_3$. Other vaporizable silicon-nitrogen compounds may, however, be used within the scope of the invention. AZS is a stable compound which does not react with air or water, and is non-explosive. Its vapor pressure is suitable for room temperature operation of the process.

Figure 1:
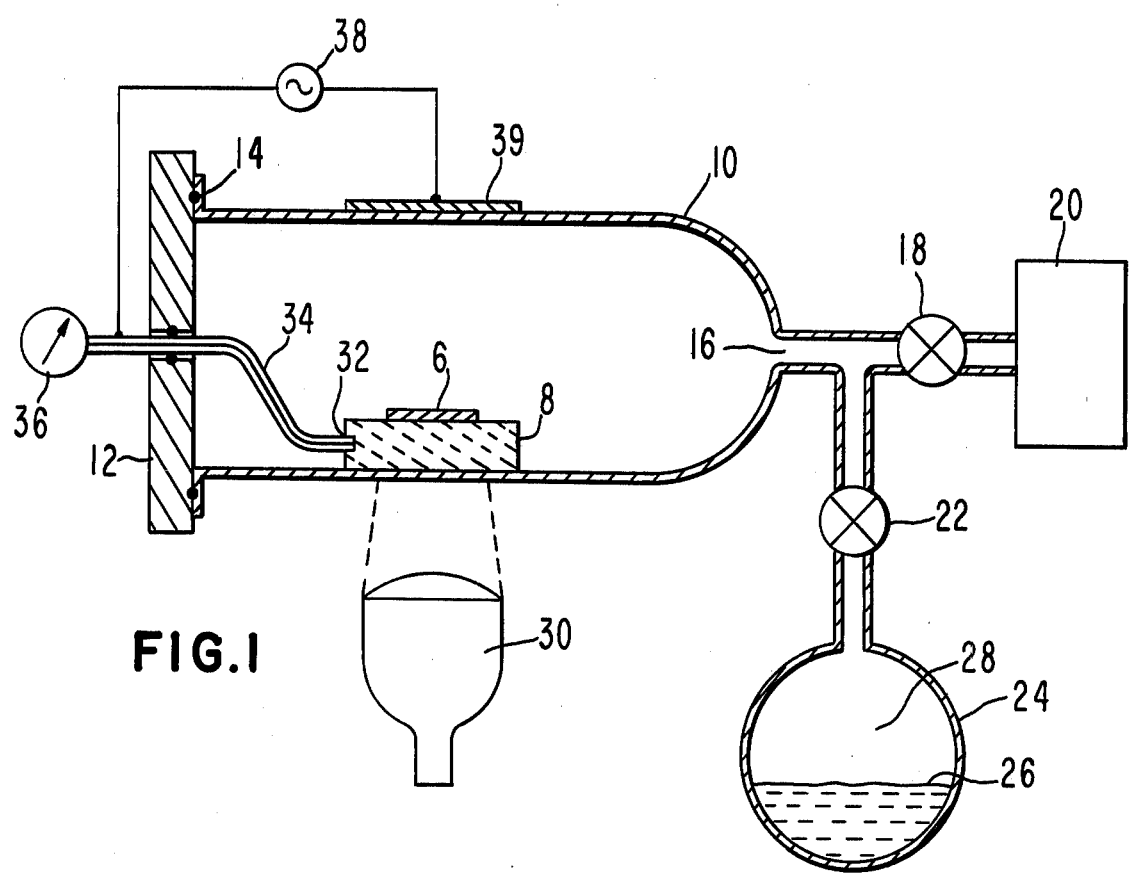
FIG. 1 is a schematic diagram of a laboratory apparatus for carrying out the inventive process.

FIG. 1 is a diagram of the apparatus used. The device 6 to be coated is placed on a holder 8 inside a vacuum furnace tube 10, as of quartz. Tube 10 is closed at its open end by a metallic base 12 with a synthetic rubber O-ring 14. The tube 10 is pumped to a good vacuum through port 16 and valve 18 by a conventional vacuum pumping system 20, shown schematically. Then valve 22 is opened, connecting tube 10 to a reservoir vessel 24 containing liquid AZS 26. The AZS vapor 28 is admitted to the reaction tube 10 to a pressure of 0.15 to 0.20 torr. Support block 8 is made of graphite and is heated by a radiant heat lamp 30 outside the tube, thereby heating device 6 to the desired temperature. Temperatures from 100-400 degrees Celsius have been found to be desirable. Reasonable deposition is possible at room temperature, but the film integrity appears to be better at 200 degrees. The deposition rate is also dependent on the substrate temperature, so for reproducible deposition the temperature is preferably controlled. For particular devices comprising tin-soldered contacts, I have found temperatures below 230 degrees to be necessary. The temperature of block 8 is measured by a thermocouple 32 connected to block 8 whose coaxial leads 34 connect to an external temperature meter 36. An electric plasma discharge is formed by applying voltage from a generator 38 of high frequency, such as 13MHz, between the thermocouple lead 34 connecting to support block 8 and an external metallic electrode 40. The AZS is decomposed in the plasma discharge, depositing a film of silicon nitride on the exposed surface of the device 6. For a film thickness of 0.1 microns, about 10 minutes is required with a discharge estimated as 10 watts and 200 degree substrate temperature.

The film produced is exceedingly dense, smooth and free of defects. Surprisingly, these films are chemically more stable than those produced by chemical-vapor-deposition (CVD) or by the aforementioned plasma vapor deposition from mixtures of silane and ammonia. For example, the AZS films are not etched by solutions of hydrofluoric or phosphoric acid, but other silicon nitride films are attacked by them. It is possible that the unexpected chemical inertness of the AZS films is due to the incorporation of methyl ($CH_3$) groups. Some evidence of the presence of methyl groups has been found by an infrared band attributable to the silicon-methyl bond. The improved performance may also be connected with the absence of oxide contaminants such as are readily produced by the reactive silanes. Regardless of the exact chemical mechanism, I have found that my AZS process results in a uniquely stable film not producible by any other process known to me.

As described above azidotrimethylsilane is a well suited material for carrying out the invention. However, other vaporizable organosilicon compounds may well be used. A compound should be selected which does not have silicon-hydrogen bonds because the latter contribute to high reactivity and instability. It is very convenient to have the nitrogen source in chemical combination with the silicon because this eliminates any problem of metering the two components of the silicon nitride. However, it is believed that a separate source of nitrogen, if properly controlled, could produce the desired result. In my AZS vapor, the silicon is bonded only to nitrogen and to the carbon atoms of the methyl groups. Other organic radicals could be substituted for the methyl groups, as long as the vapor pressure does not become too low.

Figure 2:
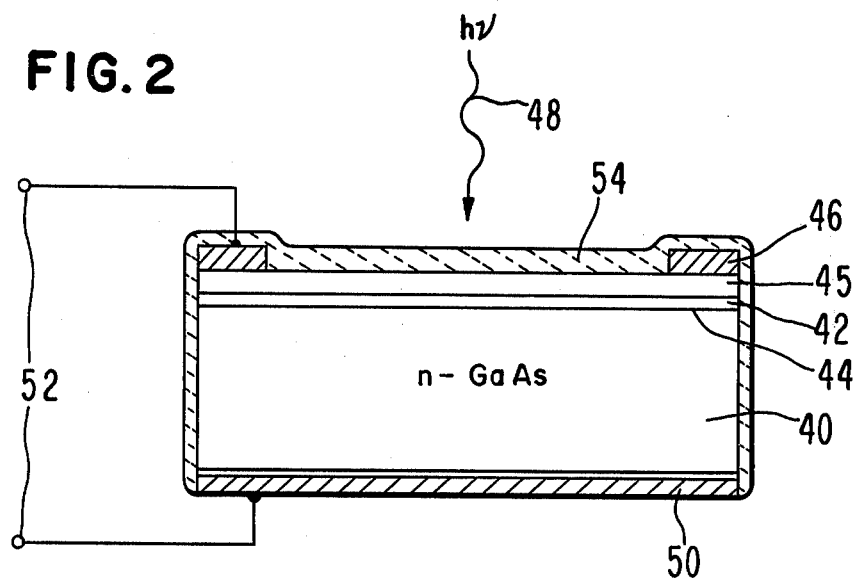
FIG. 2 is a schematic cross-section of a photovoltaic cell embodying the inventive film.

FIG. 2 shows an example of a semiconductive device whose operation is improved by including a silicon nitride film according to the invention. The device is a photovoltaic cell such as is useful for generation of electricity from sunlight. A substrate body 40 of gallium arsenide is doped to provide relatively high n-type conductivity. On the top surface of body 40 is a thin layer 42 of p-type gallium arsenide, produced for example by liquid epitaxial growth, forming a p-n junction 44 with body 40. A transparent contact layer 45 as of aluminum gallium arsenide is deposited on top of p-type layer 42. A metallic contact 46 is then deposited on a portion of the top surface of layer 45, leaving most of the area open to admit the incident light 48. A second metallic contact 50 covers the entire lower surface of substrate 40. Electrical connecting leads 52 carry off the photocurrent generated between electrodes 46 and 50. The p-type layer 42 is formed to have a band-gap to absorb incident light 48 and convert its energy to generate charge carriers in layer 42. The carriers diffuse to p-n junction 44 to create the output current.

According to the invention, a film 54 of silicon nitride is deposited from AZS to cover the top and sides of the cell. Film 54 protects the surface and insulates surface leakage paths. Film 54 in this application is also primarily an anti-reflection coating. The refractive index has been measured as 2.07, which is a desirable value for preventing reflections from gallium arsenide or aluminum gallium arsenide. The film's optical thickness is selected to be about ¼ wavelength of light so that reflections from the top and bottom surfaces of the silicon nitride will cancel. A thickness of around 1,000 Angstroms has been found to be desirable.

The above embodiment of the invention in a photovoltaic cell has been described only as one example of its utility. It will be obvious to one skilled in the art that the inventive films may be profitable used in many other kinds of semiconductive devices, such as integrated circuits, and also for non-electrical uses as protective and antireflection films. My improved silicon nitride films may be used in MIS (metal-insulator-silicon) integrated circuits as insulating layers. They may also be used as masking material for ion implantation. While my inventive films are chemically more stable than the prior art films, they cay be etched, for example, by a plasma etch using oxygen and tetrafluoro-methane. The invention is intended to be limited only by the following claims and their legal equivalents.

I claim:

1. A method for depositing a film comprising silicon nitride, said method comprising the steps of:

exposing a substrate to a vapor of azidotrimethylsilane, and creating a plasma discharge in said vapor to deposit said film comprising silicon nitride on said substrate.

2. On a substrate a film comprising silicon nitride deposited by the method of claim 1.

* * * * *